United States Patent [19]

Shimizu

[11] Patent Number: 5,663,576
[45] Date of Patent: Sep. 2, 1997

[54] PHOTOELECTIC CONVERSION ELEMENT WITH ISLANDS

[75] Inventor: Kousaku Shimizu, Tokyo, Japan

[73] Assignee: NEC Corporation, Japan

[21] Appl. No.: 523,008

[22] Filed: Sep. 1, 1995

[30] Foreign Application Priority Data

Sep. 1, 1994 [JP] Japan .................. 6-208581

[51] Int. Cl.$^6$ .................................. H01L 31/00
[52] U.S. Cl. ............... 257/59; 257/72; 257/446; 257/448; 257/435; 257/457
[58] Field of Search ................ 257/59, 72, 448, 257/446, 447, 435, 457

[56] References Cited

U.S. PATENT DOCUMENTS

| | | | |
|---|---|---|---|
| 5,177,577 | 1/1993 | Taniguchi et al. | 257/59 |
| 5,184,200 | 2/1993 | Yamanobe | 257/59 X |
| 5,243,202 | 9/1993 | Mori et al. | 257/59 |
| 5,294,811 | 3/1994 | Hoyama et al. | 257/59 |

FOREIGN PATENT DOCUMENTS

| | | | |
|---|---|---|---|
| 63-161683 | 7/1988 | Japan . | |
| 63-232366 | 9/1988 | Japan . | |
| 3278468 | 12/1991 | Japan . | |
| 3278478 | 12/1991 | Japan . | |
| 3278479 | 12/1991 | Japan . | |
| 4186880 | 7/1992 | Japan | 257/59 |

*Primary Examiner*—William Mintel
*Attorney, Agent, or Firm*—Ostrolenk, Faber, Gerb & Soffen, LLP

[57] ABSTRACT

A photoelectric conversion element having an improved δ characteristic is constructed of an insulation film and a photoelectric conversion film formed as islands. These films are stacked successively on a shield film formed on a transparent insulating substrate. Electrodes that connect the islands of the photoelectric conversion film together are formed at prescribed intervals and in prescribed widths so that each of the electrodes covers the upper surface of a different end portion of the photoelectric conversion film. A low resistance film is provided between the photoelectric conversion film and each of the electrodes.

8 Claims, 16 Drawing Sheets

WIDTH OF SHIELD FILM W2 /
WIDTH OF PHOTOELECTRIC FILM W1

THICKNESS OF SILICON – RICH SILICON NITRIDE FILM

THICKNESS OF SILICON – RICH SILICON NITRIDE FILM
/THICKNESS OF PHOTOELECTRIC CONVERSION FILM

THICKNESS OF SILICON – RICH SILICON NITRIDE FILM

THICKNESS OF SILICON – RICH SILICON NITRIDE FILM

AMOUNT OF CUTTING OF THE INSULATION FILM
ON THE UPPER SURFACE OF THE BACK CHANNEL

THICKNESS OF SILICON – RICH SILICON NITRIDE FILM

PHOTOELECTIC CONVERSION ELEMENT WITH ISLANDS

BACKGROUND OF THE INVENTION

1. Field of the Invention

The present invention relates to a photoelectric conversion element that can be used in a facsimile, image scanner, or other similar device.

2. Description of the Related Art

Amorphous materials are often used in thin-formed photoelectric conversion devices used in image-reading apparatus such as facsimiles or image scanners. Photoelectric conversion elements formed from such amorphous materials can be broadly divided between the diode-type and TFT-type (Thin Film Transistor). As photoelectric conversion elements of the diode-type, Schottky-type, pi-type (p-intrinsic), and pin-type (p-intrinsic-n) elements using a primary photocurrent are known, and as photoelectric conversion elements of the TFT-type, nin-type and pip-type elements using a secondary photocurrent are known.

In the types using a primary photocurrent, although the γ characteristic showing output linearity is approximately 1 and the response time is approximately 10 microseconds (~10 (μ sec)), a great burden is placed on the signal processing circuit in order to obtain a sufficient S/N ratio from the small photocurrent obtained. On the other hand, in types using a secondary photocurrent, although a small S/N ratio can be obtained from the large photocurrent, the γ characteristic is on the order of 0.8 and the response time is on the order of 10 milliseconds.

In order to enable high-speed and high-graduation reading in photoelectric conversion devices of the TFT-type, which use a secondary photocurrent, it is necessary to shorten the life of the transient carrier and decrease parasitic capacity. To achieve these goals, the configuration of the photoelectric conversion element, the material of the photoelectric conversion film, and control over the MIS [Metal Insulator Semiconductor] plane and backchannel plane all become crucial.

Japanese Patent Laid-open No. 232366/88 discloses a shield film having dimensions equal to or slightly greater than the photoreception area. This construction enables a great decrease in the amount of overlap of the upper electrode, which is believed to influence response time, and further controls focus of the electric field, thereby allowing suppression of pinhole defects.

Nevertheless, there remains the problem that in a contact-type photoelectric conversion element in which light is introduced from behind the transparent insulation film, reduction of the size of the shield film results in a drastic increase in the light directly introduced into the photoelectric conversion section, thereby causing a large signal output due to light leakage and an increase in apparent dark current resulting in a reduced light/dark ratio.

In addition, in the amorphous silicon layer used in an a-SiTFT of the prior art, a film having extremely small defect density is formed. Because the TFT is formed simultaneously, this film is necessary to provide a satisfactory switch element.

Nevertheless, when the above-described amorphous silicon film is used as a photoelectric conversion element, as described in, for example, Japanese Patent Laid-open No. 161683/88, there is a problem that arises because the light signal becomes unstable due to the occurrence of transient fluctuation in the electric potential of the light shield film, which becomes a gate electrode. This phenomenon is chiefly caused by channels formed in the MIS interface.

Furthermore, there is distortion in the defect level of the amorphous silicon film of the back channel portion, which is the light-receiving plane, and in the band of the bonding plane of the amorphous silicon layer and the insulating layer that serves as a protective layer. Japanese Patent Laid-open Nos. 278468/91, 278478/91, and 278479/91 disclose that by using a silicon nitride film in which the ratio of nitrogen to silicon (N/Si) is 0.5–0.9 as a protective layer, band distortion can be reduced as compared with constructions that utilize an insulating silicon nitride film of the prior art (having the composition ratio [N/Si]=1.3), thus allowing suppression of the formation of an accumulation layer formed in the back channel portion. This is because the optical gap is largely 5.3 (eV) in the insulating silicon nitride layer and about 2.0 (eV) in the silicon-rich silicon film, and the energy difference as compared with the amorphous silicon film of about 1.73 (eV) is extremely small.

However, if a silicon-rich silicon nitride film is formed on the photoelectric conversion element as a protective layer, the above-described silicon-rich silicon nitride layer has a photoelectric conversion ability for light having a wavelength of 570 nm, and therefore, the light-receiving portion is actually larger, and in theory, this means that despite an increase in photocurrent, response time lengthens because photoelectric charge is held in the vicinity of the element. This phenomenon has been confirmed in experiments conducted by the inventors.

Furthermore, regarding the manufacturing process of the photoelectric conversion element, if a low-resistance film formed to connect the photoelectric conversion film and the upper metal electrode forms on the backchannel portion (light-receiving surface), it must be removed by a dry-etching method, and this etching gives rise to lattice defects due to plasma damage in the photoelectric conversion film directly below the low-resistance film. These lattice defects easily combine with impurities during the manufacturing process, and if these impurities are electrically charged bodies, there is the problem in that interaction with the light carrier and fluctuation due to electric potential gradient between electrodes influence the characteristic of the photoelectric conversion element.

Of the above-described photoelectric conversion elements of the prior art, the element described in Japanese Patent Laid-open No. 232366/88 suffers from the drawback that reduction of shield film size results in a radical increase in light directly incident to the photoelectric converter, and large signal output due to leakage of light and a increase of apparent dark current results in a reduced light/dark ratio.

In addition, there is the problem that in an amorphous silicon film used in an a-SiTFT, the optical signal becomes unstable due to transient fluctuation of the electrical potential in the shield film, which is a gate electrode.

Furthermore, in elements wherein a silicon nitride film having a nitrogen-to-silicon ratio [N/Si] of 0.5–0.9 is employed as a protective layer, as described in Japanese Patent Laid-open Nos. 278468/91, 278478/91, and 278479/91, there is the problem that in forming a silicon-rich silicon nitride film with a photoelectric conversion ability for light having a wavelength of 570 nm as a protective layer on a photoelectric conversion element, the light-receiving portion effectively increases in size, so that although in principle the photocurrent increases, response time is conversely lengthened because a photoelectric charge is held in the vicinity of the element.

Furthermore, there is the problem that manufacturing processes tend to bring about dispersion in the characteristics of photoelectric conversion elements, resulting in instability.

SUMMARY OF THE INVENTION

The present invention was achieved by considering the various problems encountered in the above-described prior art and has the object of realizing a photoelectric conversion element having improved light/dark ratio, γ characteristic, and response time.

A photoelectric conversion element of the present invention is characterized in that an insulation film and a photoelectric conversion film converted to islands are successively stacked on a shield film formed on a transparent insulating substrate, electrodes connecting together the photoelectric conversion film islands are formed at a prescribed interval and in prescribed widths so as to cover the upper surface of the end portion of the photoelectric conversion film, and a low-resistance film is provided between the photoelectric conversion films and the electrodes.

According to another modification of the photoelectric conversion element of the present invention, an insulation film and a photoelectric conversion film are successively stacked on a light shield film formed on a transparent insulating substrate, two electrodes are formed at a prescribed interval and in prescribed widths so as to cover the upper surface of the end portion of the photoelectric conversion film, and a low-resistance film is provided between each of the electrodes and the photoelectric conversion film, the photoelectric conversion film being a silicon-rich silicon nitride film having a nitrogen-to-silicon ratio [N/Si] of 0.3 to 1.0.

According to yet another modification of the photoelectric conversion element of the present invention, an insulation film and a photoelectric conversion film are successively stacked on a shield film formed on a transparent insulating substrate, two electrodes are formed at a prescribed interval and in prescribed widths so as to cover the upper surface of the end portion of the photoelectric conversion film, and a low-resistance film is provided between each of the electrodes and the photoelectric conversion film, the photoelectric conversion film being a stacked structure comprising at least one or more of both an amorphous silicon film and a silicon-rich silicon nitride film having a nitrogen-to-silicon ratio [N/Si] of 0.3 to 1.0. In this case, the photoelectric conversion film may be a stacked structure comprising an amorphous silicon film and a silicon-rich silicon nitride film having a nitrogen-to-silicon composition ratio [N/Si] of 0.3–1.0 that are successively stacked on the insulation film, the silicon-rich silicon nitride film having a film thickness of 100 nm or less.

In addition, the photoelectric conversion film may be a stacked structure comprising an amorphous silicon film, a silicon-rich silicon nitride film having a nitrogen-to-silicon composition ratio [N/Si] of 0.3–1.0, and an amorphous film that are successively stacked on the insulation film, the silicon-rich silicon nitride films having a film thickness of 100 nm or more.

The photoelectric conversion film may further be a stacked structure comprising a silicon-rich silicon nitride film having a nitrogen-to-silicon composition ratio [N/Si] of 0.3–1.0, an amorphous film, and a silicon-rich silicon nitride film having a nitrogen-to-silicon composition ratio [N/Si] of 0.3–1.0 that are successively stacked on the insulation film, the lower silicon-rich silicon nitride film having a film thickness of 100 nm or less and the upper silicon-rich silicon nitride film having a film thickness of 100 nm or more.

According to yet another modification of the photoelectric conversion element of the present invention, a first insulation film, a photoelectric conversion film, and a second insulation film that is converted to islands are successively stacked on a shield film formed on a transparent insulating substrate; electrodes connecting together the second insulation film formed as islands are formed at a prescribed interval and in prescribed widths so as to cover the upper surface of the end of the second insulation film; and a low-resistance film is provided between the second insulation film and the electrode.

According to yet another modification of the photoelectric conversion element of the present invention, an insulation film, a first photoelectric conversion film, and a second photoelectric conversion film, which is a silicon-rich silicon nitride film converted to islands, are successively stacked on a light shield film formed on a transparent insulating substrate; electrodes connecting together the islands of the second photoelectric conversion film are formed at a prescribed interval and in prescribed widths so as to cover the upper surface of the end portion of the second photoelectric conversion film; and a low-resistance film is provided between the second photoelectric conversion film and the electrodes.

In the photoelectric conversion element of the present invention constructed as described hereinabove, by both converting the photoelectric conversion film to islands and adopting a structure wherein electrodes cover an upper surface of the end portion of the photoelectric conversion film, light directly incident upon the photoelectric conversion film from behind the surface is blocked, thereby shortening response time and improving light/dark ratio and γ characteristics.

The above and other objects, features, and advantages of the present invention will become apparent from the following description based on the accompanying drawings which illustrate an example of a preferred embodiment of the present invention.

DETAILED DESCRIPTION OF THE PREFERRED EMBODIMENTS

The present invention will next be explained with reference to the accompanying figures.

First Embodiment

Figure 1:
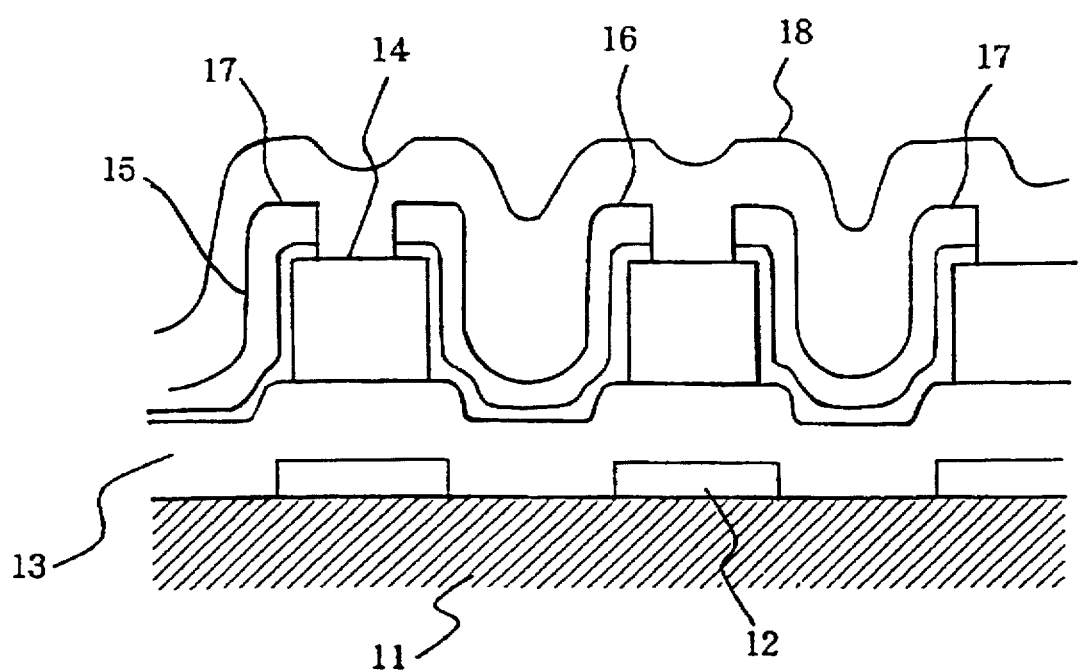
FIG. 1 is a schematic sectional view showing the construction of the first embodiment of the present invention.
Figure 2:
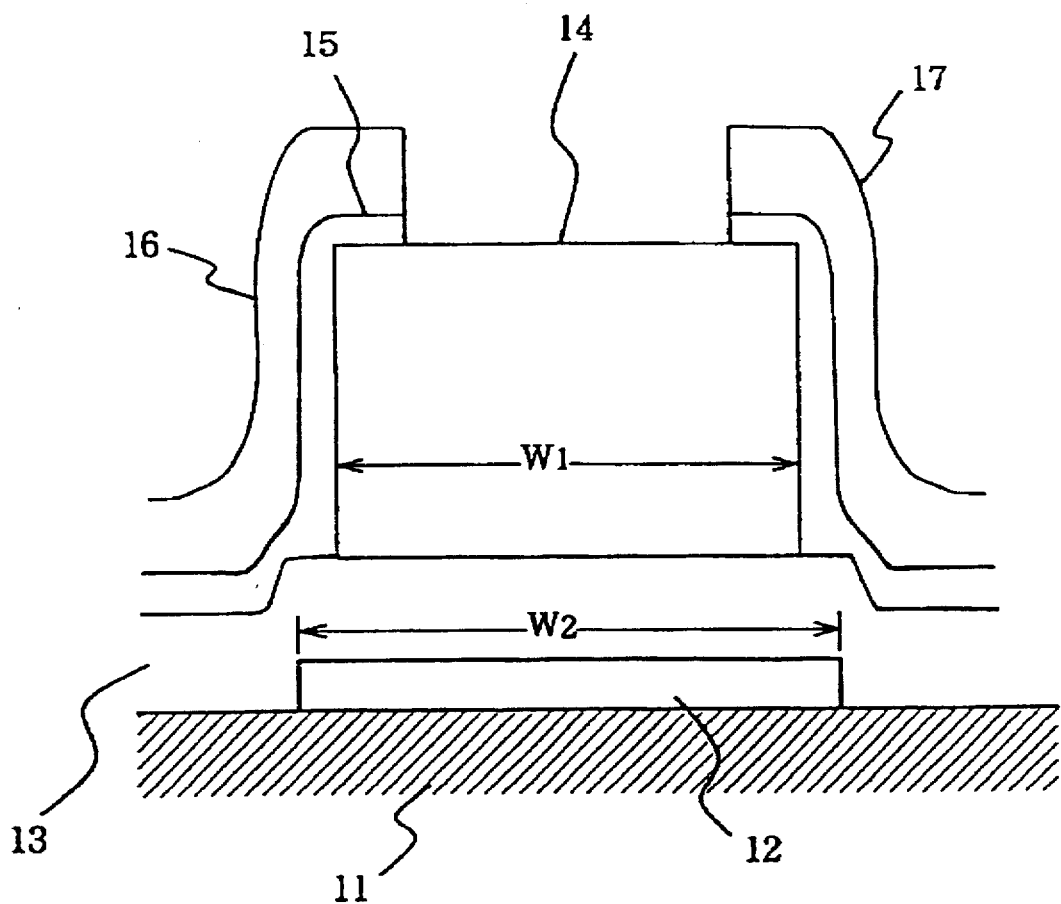
FIG. 2 is an enlargement of a portion of FIG. 1.

FIG. 1 is a schematic sectional view showing the construction of the first embodiment of the photoelectric conversion element according to the present invention, and FIG. 2 is an enlarged view of a portion of FIG. 1. The manufacturing process of this embodiment will first be explained with reference to FIG. 1.

In the photoelectric conversion element of this embodiment, insulation film 13 and photoelectric conversion film 14, which is converted to islands, are successively stacked on shield film 12 formed on glass substrate 11, which is a transparent insulating substrate; first electrode 16 and second electrode 17 that connect together the islands of photoelectric conversion film 14 are formed at prescribed intervals and widths so as to cover the upper surface of the end portions of photoelectric conversion film 14; and low-resistance film 15 is provided between photoelectric conversion film 14 and electrodes 16, 17.

As light shield film 12, a 100-nm layer of chrome is first formed on the transparent glass substrate 11 by a sputtering method and then patterned by a lithographic process. An insulating silicon nitride film (insulation film 13) and an amorphous silicon film are then successively formed by a plasma CVD method. The insulating silicon nitride film is formed to 200 nm using silane, ammonia and nitrogen gas at a flow rate of 100, 200, and 2000 SCCM, respectively, and with power density at 0.08 W/cm$^2$, gas pressure at 120 Pa and substrate temperature at 300 C. The speed of deposition under these conditions is 31.6 nm/min. The amorphous silicon film is formed to 350 nm using silane gas (SiH$_4$) and hydrogen gas at a flow rate of 90 and 270 SCCM, respectively, and with power density at 0.04 W/cm$^2$, gas pressure at 120 Pa, and substrate temperature at 250° C. The speed of deposition under these conditions is 2.5 nm/min.

Photoelectric conversion film 14 is next formed by converting only the amorphous silicon film to islands. To effect this conversion to islands, SF$_6$, hydrogen gas and chlorine gas are used at a flow rate of 30, 30, and 120 SCCM, respectively, the power density is 0.48 W/cm$^2$, gas pressure is 30 Pa, and the substrate temperature is 30° C. The etching rate under these conditions is 2 nm/sec, and the ratio of selection of the insulating silicon nitride film to the amorphous silicon film is about 1:10.

Next, an n$^+$layer (low-resistance film 15) is formed by again using a plasma CVD method with phosphine as a dopant. Formation was carried out to a film thickness of 70 nm using silane, hydrogen diluted with 0.1% phosphine, and hydrogen gas at flow rates of 300, 450, and 150 SCCM, respectively, and with power density at 0.015 W/cm$^2$, gas pressure at 100 Pa, and the substrate temperature at 250° C. Under these conditions, the speed of deposition is 25 nm/min. In addition, chrome is again formed to 200 nm, following which electrodes are patterned to form first electrode 16 and second electrode 17 as shown in the figure, and low-resistance film 15 remaining in channel portions is etched using the same dry-etching method and conditions as described hereinabove. Finally, using a CVD method, an insulating silicon nitride film is formed to 400 nm as protective film 18 by the same film formation conditions as described hereinabove.

Figure 3:
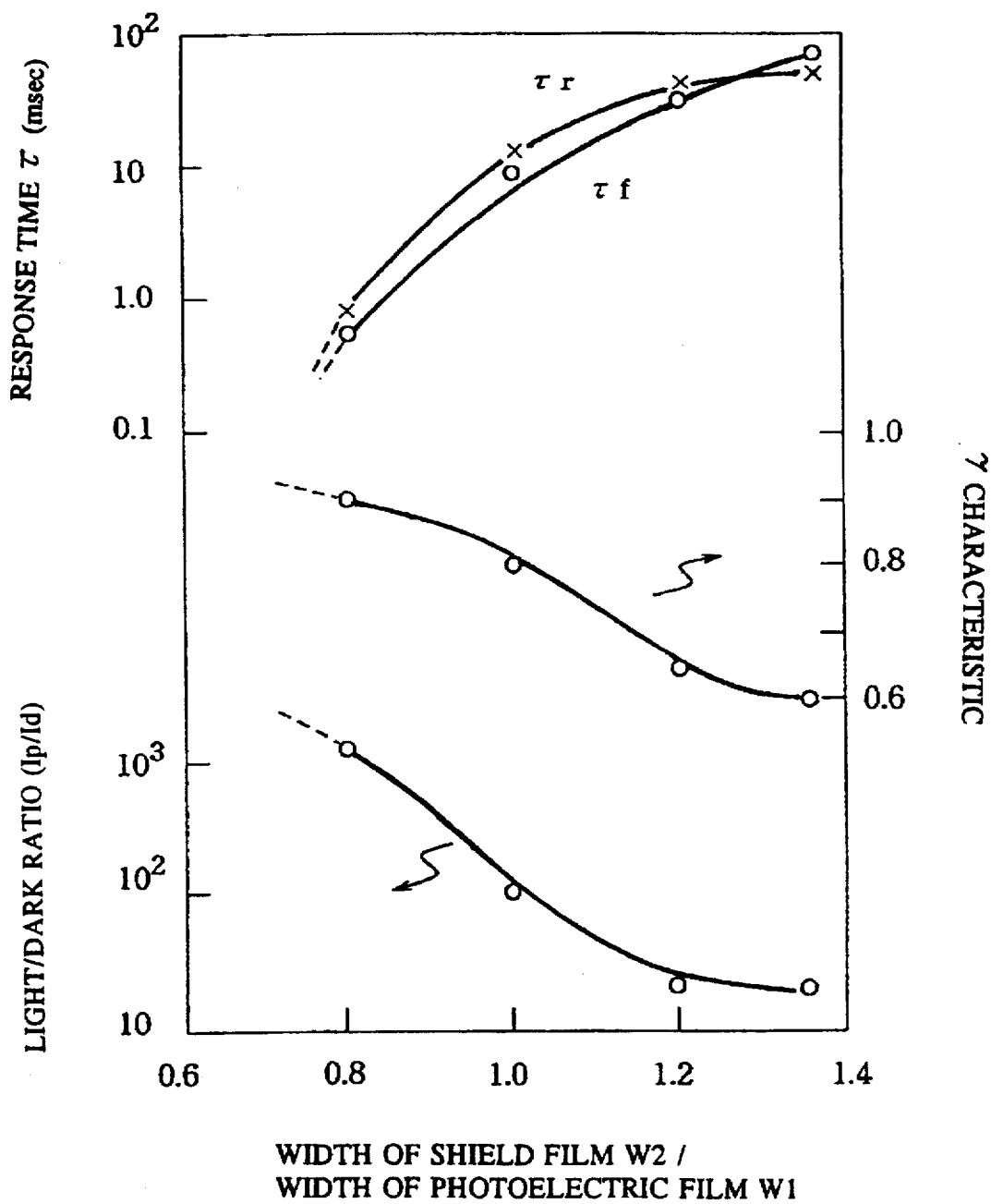
FIG. 3 is a graph showing dependence of the light/dark ratio, γ characteristic, and response time on the ratio of the width of the light shield film to the width of the photoelectric conversion film for the first embodiment.

FIG. 3 is a graph showing the ratio of size of shield film 12 to photoelectric conversion film 14 wherein τr and τf indicate response time for rise and fall, respectively, and W1 and W2 indicate the width of light shield film 12 and photoelectric conversion film 14, respectively, shown in the partial enlargement of FIG. 2.

From FIG. 3, it can be seen that when W2/W1 is greater than 1, the light/dark ratio and γ characteristic decrease while the response time increases. These effects are the result of increase of apparent dark current resulting from the direct incidence of light from a rear light source. Here, the values are for response time defined as 10% and 90% rise and fall time, respectively, at one-second period and ½ duty.

Accordingly, it is clear that the size of photoelectric conversion film 14 is preferably equal to or less than 0.8 the width of light shield film 12. Moreover, it can be seen that a construction in which photoelectric charge is taken from the end portion of photoelectric conversion film 14 serves to block light directly incident from the rear surface, thereby shortening response time and improving light/dark ratio and γ characteristic.

Second Embodiment

Figure 4:
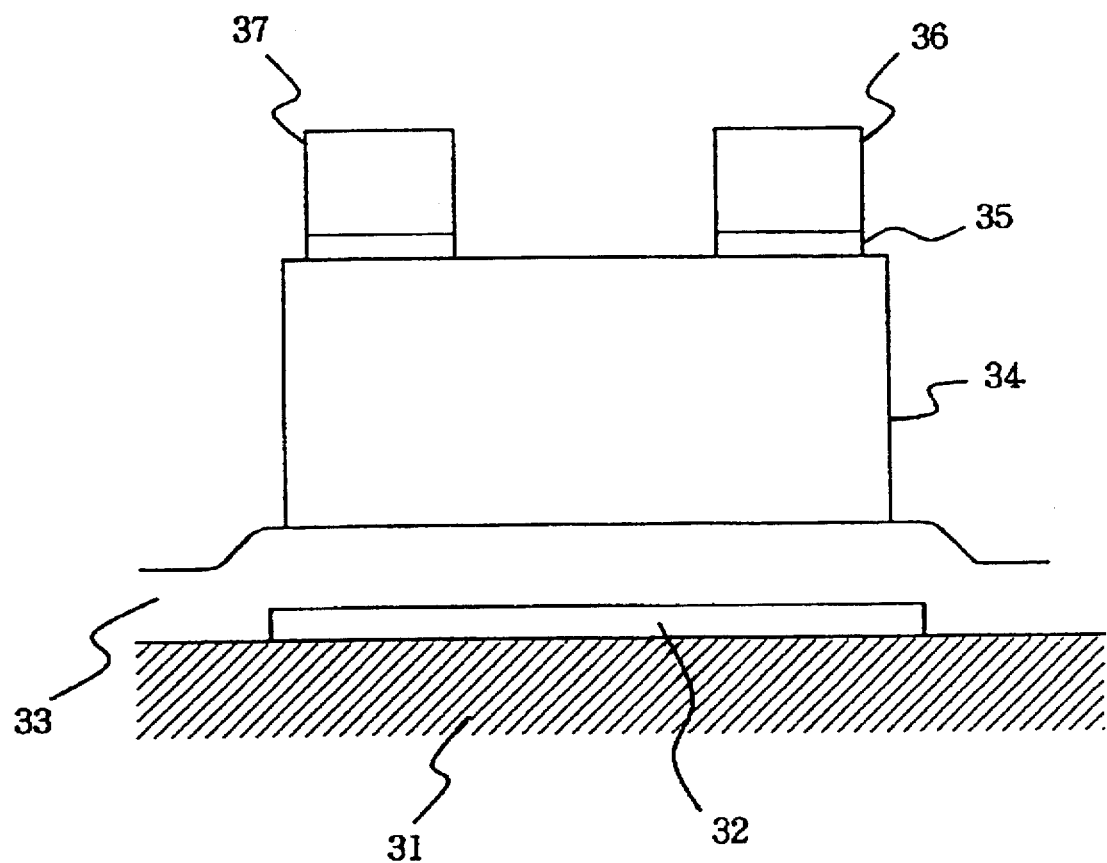
FIG. 4 is a schematic sectional view showing the construction of the second embodiment of the present invention.

FIG. 4 is a schematic sectional view showing the construction of a second embodiment of the present invention. In the photoelectric conversion element of this embodiment, insulation film 33 and photoelectric conversion film 34 are successively stacked on shield film 32 formed on glass substrate 31, which is a transparent insulating substrate; first electrode 36 and second electrode 37 are formed at prescribed intervals and widths so as to cover the upper surface of the end portion of the photoelectric conversion film 34; and low-resistance film 35 is formed between photoelectric conversion film 34 and each electrode 36, 37; the photoelectric conversion film 34 being a silicon-rich silicon nitride film in which the nitrogen-to-silicon composition ratio [N/Si] is 0.3–1.0. Consequently, the device in FIG. 4 in which an amorphous silicon film is used as photoelectric conversion film 34 is a photoelectric conversion element of the prior art.

Figure 5:
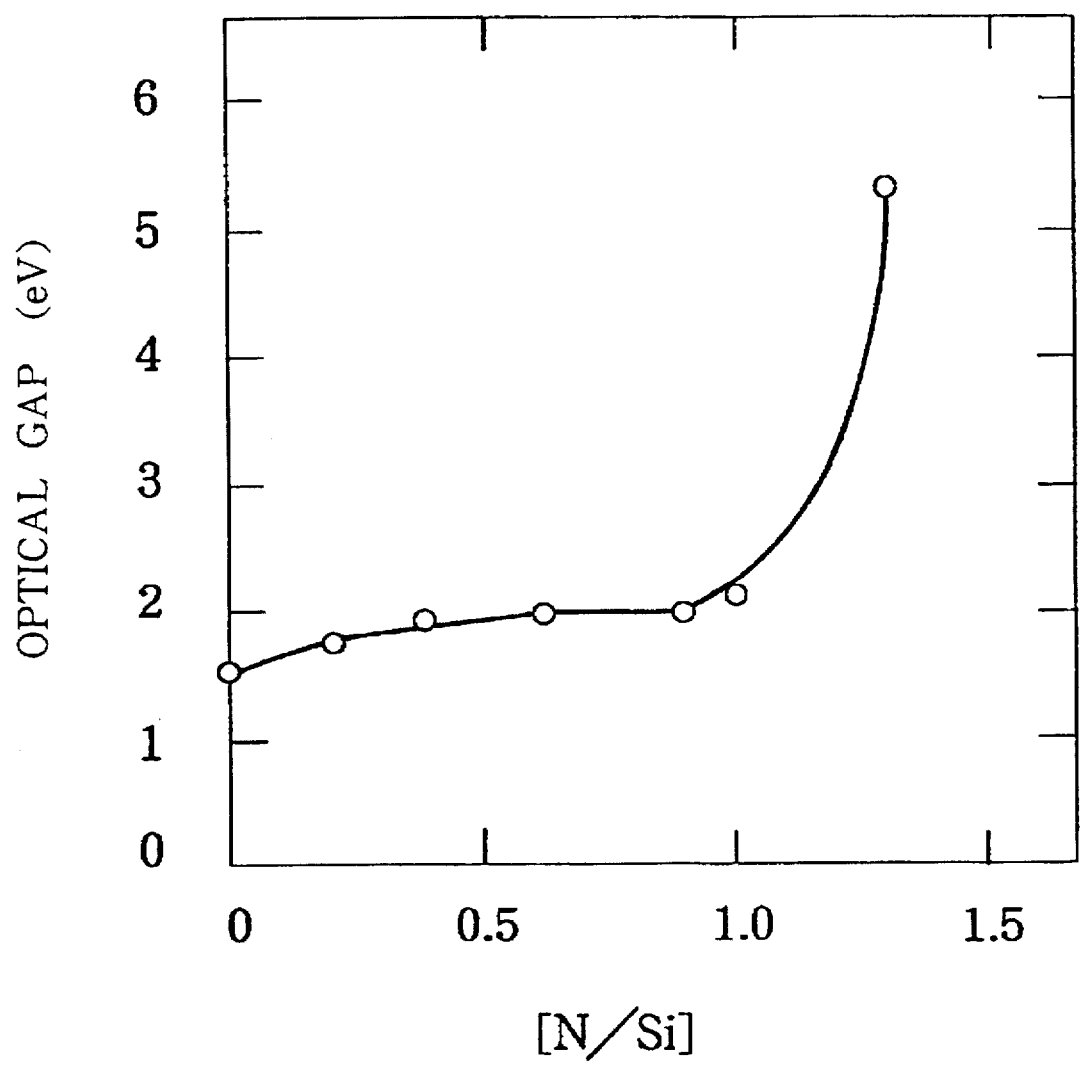
FIG. 5 is a graph showing dependence of the optical gap on the nitrogen-to-silicon composition ratio [N/Si] for the second embodiment.

FIG. 5 is a graph showing the dependence of the silicon nitride film optical gap on the nitrogen-to-silicon composition ratio [N/Si]. From this graph it can be seen that the optical gap is stable between 1.9 to 2.1 (eV) when the composition ratio is in the range of 0.3 to 1.0. This is a range suitable for a silicon-rich silicon nitride film because there is ample latitude even allowing for a large processing margin, and it can be seen that this range is preferably used for photoelectric conversion film 34 shown in FIG. 4. This range exhibits high absorption coefficient, particularly for light having wavelength of 570 nm (2.18 eV), and allows suppression of the formation of channel portions in the interface with the insulating silicon nitride film.

Regarding manufacturing conditions of photoelectric conversion film 34 in this embodiment, a silicon-rich silicon nitride film is formed to 330 nm with the flow rates of silane, nitrogen, and hydrogen gas at 15, 150, and 700 SCCM, respectively, power density at 0.025 W/cm$^2$, gas pressure at 100 Pa, and substrate temperature at 320 C. The speed of deposition is 5.3 nm/sec.

As for the formation processes of a photoelectric conversion element, a chrome film is formed as shield film 32 on transparent glass substrate 31 and patterned. Next, an insulating silicon nitride film, a silicon-rich silicon nitride film, and an n$^+$amorphous silicon film are successively formed as insulation film 33, photoelectric conversion film 34, and low-resistance film 35, respectively; and low-resistance film 35 and photoelectric conversion film 34 are then converted to islands by dry etching. Next, a chrome film is formed to create the upper electrodes, first electrodes 36 and second electrode 37, and patterning is carried out. Low-resistance film 35 is then dry etched in the back channel portion, and finally, photoelectric conversion film 34 is formed for passivation, thus completing the photoelectric conversion element.

The conditions for forming insulation film 33 and low-resistance film 35 are the same as for the first embodiment, and the conditions for forming the silicon-rich silicon nitride film which serves as photoelectric conversion film 34 are also the same as those described hereinabove.

Figure 6:
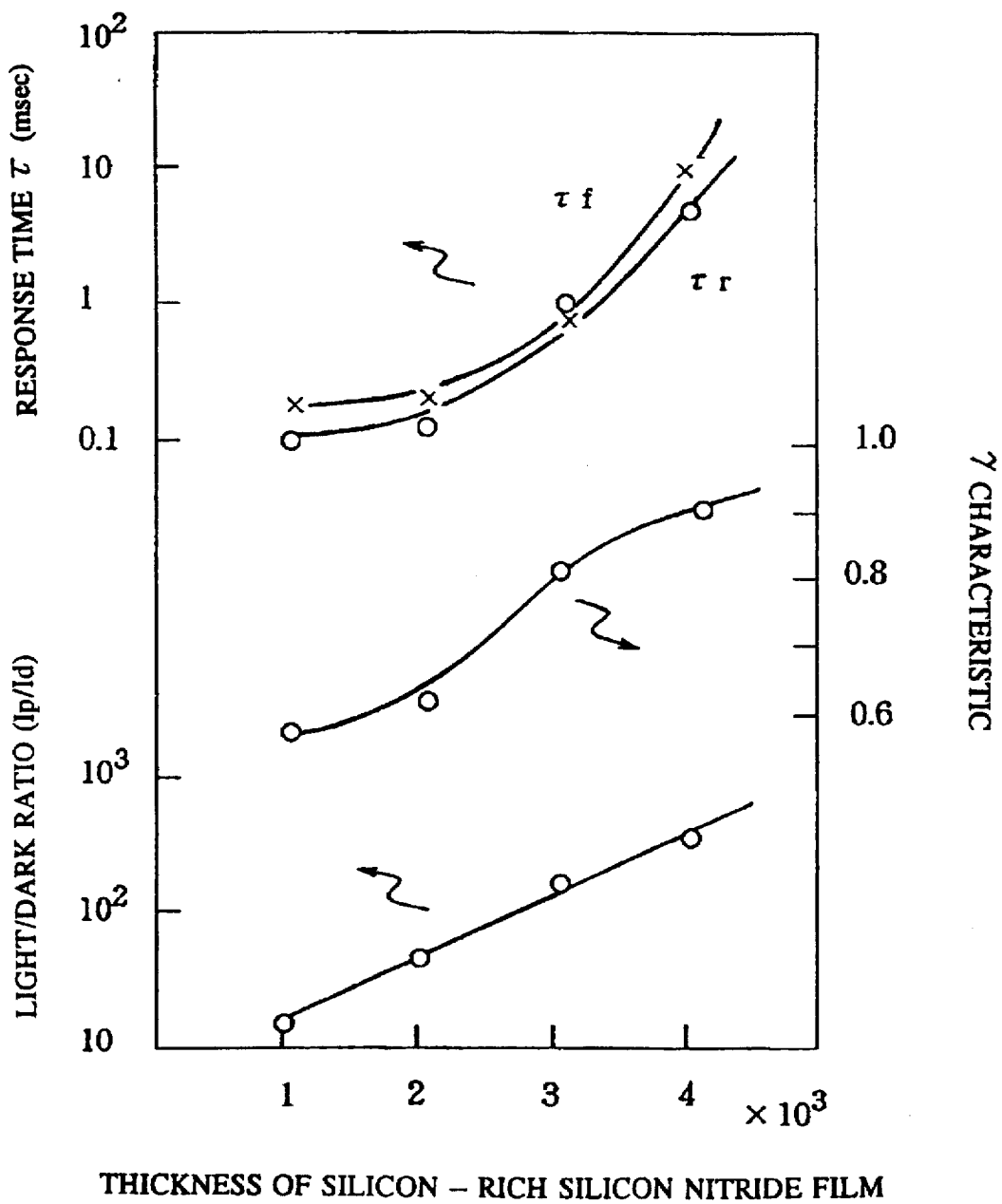
FIG. 6 is a graph showing dependence of the light/dark ratio, γ characteristic and response time on the film thickness of the silicon-rich silicon nitride film for the second embodiment.

FIG. 6 is a graph showing the dependence of the light/dark ratio, γ characteristics, and response time on the film thickness of the silicon-rich silicon nitride film. From this graph, it can be seen that the film thickness of the silicon-rich silicon nitride film is preferably 300 nm or more, and, considering response time, preferably 400 nm or less. Response time is short when the silicon-rich silicon nitride film thickness is small because a large light/dark ratio is not obtained.

Because a silicon-rich silicon nitride film is used in place of an amorphous silicon film in the photoelectric conversion element of this construction, formation of channels can be suppressed since the defect density of a silicon-rich silicon nitride film is greater than for an amorphous silicon film, and transient current can be suppressed since the life time of the optical carrier is short.

Third Embodiment

Figure 7:
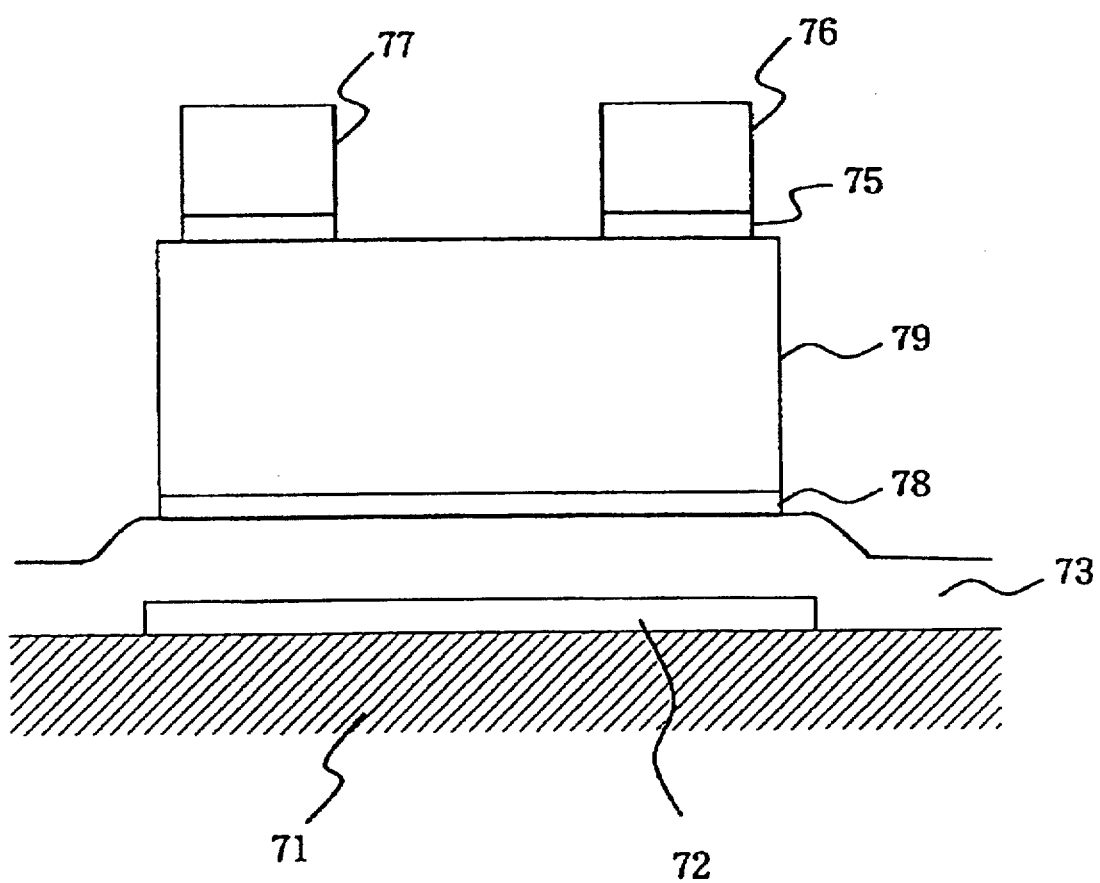
FIG. 7 is a schematic sectional view showing the construction of the third embodiment of the present invention.

FIG. 7 is a schematic sectional view showing the construction of the third embodiment of the present invention. This embodiment prevents or suppresses the formation of channels in the interface of the insulation film and photoelectric conversion film. In this embodiment, insulation film 73, first photoelectric conversion film 78, and second photoelectric conversion film 79 are successively stacked on light shield film 72 formed on glass substrate 71, which is a transparent insulating substrate; first electrode 76 and second electrode 77 are formed at prescribed intervals and widths so as to cover the upper surface of the end portion of second photoelectric conversion film 79; and low-resistance film 75 is formed between second photoelectric conversion film 79 and each electrode 76, 77. Each of the photoelectric conversion films is an amorphous silicon film or a silicon-rich silicon nitride film having a film thickness of 100 nm or less and in which the nitrogen-to-silicon composition ratio [N/Si] is 0.3–1.0.

Regarding the manufacturing process of this embodiment, shield film 72 is formed by the same process as for the first embodiment, following which insulation film 73 is formed by the same process as for the second embodiment, a silicon-rich silicon nitride film is formed to 30 nm as first photoelectric conversion film 78 in the same manner as the equivalent component described in the second embodiment, and further, an amorphous silicon film is formed to 300 nm as second photoelectric conversion film 79 in the same manner as the equivalent component described in the first embodiment, each film being stacked in succession. Fabricating processes following stacking are as for the first embodiment.

Figure 8:
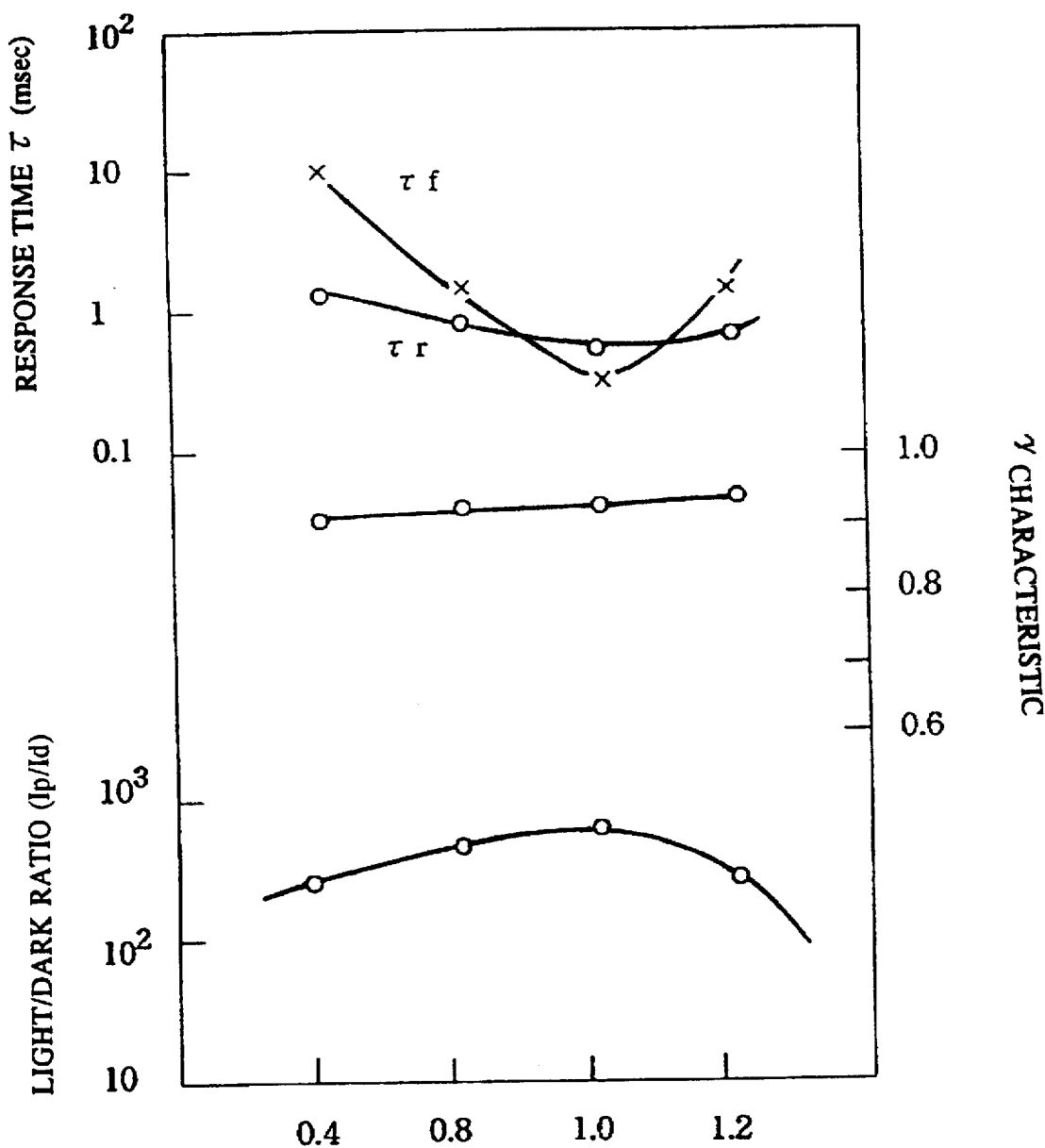
FIG. 8 is a graph showing the dependence of the light/dark ratio, γ characteristic and response time on the ratio of the film thickness of the silicon-rich silicon nitride film to the film thickness of the photoelectric conversion film for the third embodiment.

FIG. 8 is a graph showing the dependence of the light/dark ratio, γ characteristic, and response time on the ratio of the silicon-rich silicon nitride film thickness to the photoelectric conversion film thickness for the photoelectric conversion element of this embodiment. Here, the photoelectric conversion film thickness is the sum of the film thicknesses of the amorphous silicon film and the silicon-rich silicon nitride film. In FIG. 8, the photoelectric conversion film thickness is fixed at 400 nm. If the film thickness of the silicon-rich silicon nitride film is increased and the proportion of silicon-rich silicon nitride film increases, the light/dark ratio decreases because a silicon-rich silicon nitride film has lower optical sensitivity than an amorphous silicon film. In addition, because fall time is highly dependent on the proportion of the silicon-rich film thickness, the film thickness ratio must be set within 0.10±0.01 to produce a response time of 1 msec or less.

Fourth Embodiment

Figure 9:
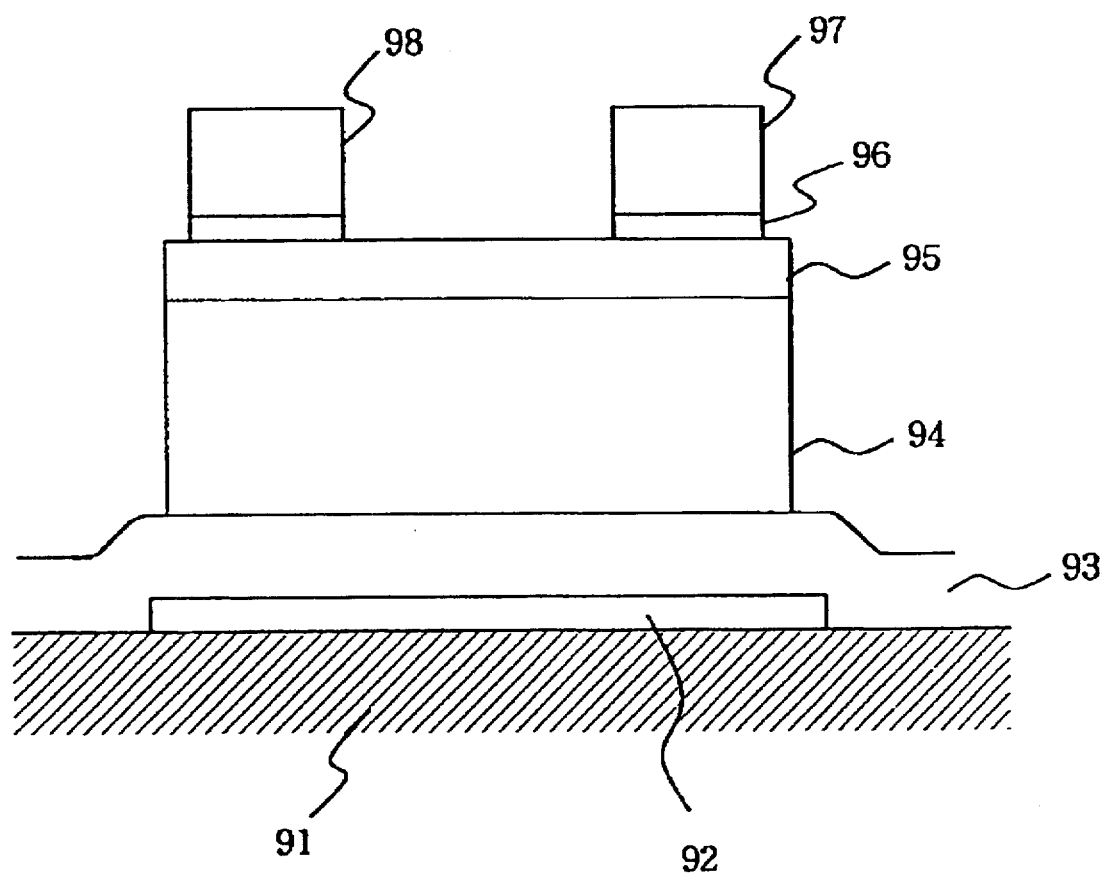
FIG. 9 is a schematic sectional view showing the construction of the fourth embodiment of the present invention.

FIG. 9 is a schematic sectional view showing the construction of the fourth embodiment of the present invention. In this embodiment, the order of film formation of the amorphous silicon film and silicon-rich silicon nitride film has been reversed from that of the third embodiment. The stacked construction of glass substrate 91, light shield film 92, insulation film 93, first photoelectric conversion film 94, second photoelectric conversion film 95, low-resistance film 96, first electrode 97, and second electrode 98 in FIG. 9 are identical to the glass substrate 71, shield film 72, insulation film 73, first photoelectric conversion film 78, second photoelectric conversion film 79, low-resistance film 75, first electrode 76 and second electrode 77 shown in FIG. 7, the only differing points being that a silicon-rich silicon nitride film is used as second photoelectric conversion film 95 and an amorphous silicon film is used as first photoelectric conversion film 94.

Figure 10:
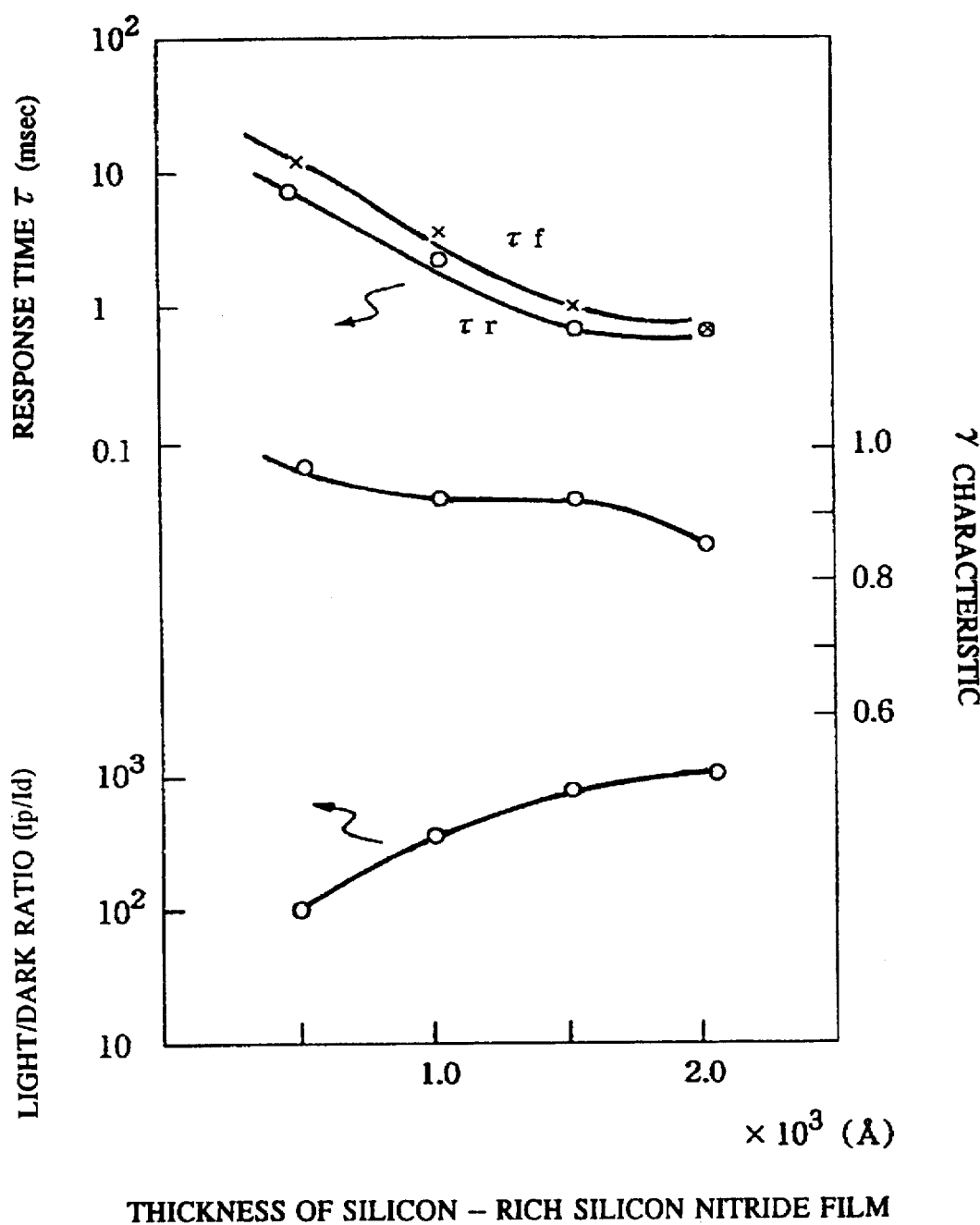
FIG. 10 is a graph showing the dependence of the light/dark ratio, γ characteristic and response time on the film thickness of the silicon-rich silicon nitride film for the fourth embodiment.

FIG. 10 is a graph showing the dependence of the light/dark ratio, γ characteristic, and response time on the film thickness of the silicon-rich silicon nitride film in this embodiment. Here it can be seen that as the film thickness of the silicon-rich silicon nitride film increases, the light/dark ratio tends to increase and the response time tends to decrease.

Accordingly, the thickness of the silicon-rich silicon nitride film is preferably 150 nm or more.

Fifth Embodiment

Figure 11:
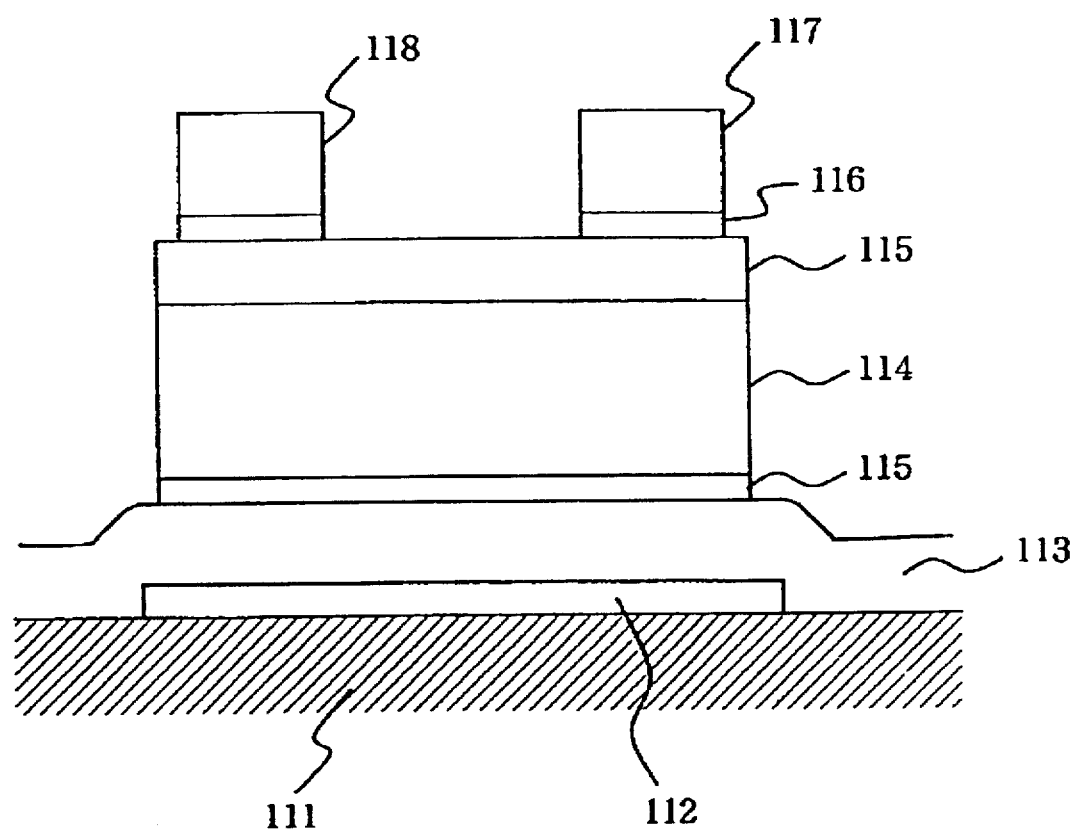
FIG. 11 is a schematic sectional view showing the construction of the fifth embodiment of the present invention.

FIG. 11 is a schematic sectional view showing the construction of the fifth embodiment of the present invention.

As the photoelectric conversion layer, the photoelectric conversion element of this embodiment has second photoelectric conversion film 114, which is an amorphous silicon film, formed between first photoelectric conversion films 115, which are silicon-rich silicon nitride films. Aside from these components, the stacked construction of glass substrate 111, shield film 112, insulation film 113, low-resistance film 116, first electrode 117, and second electrode 118 is identical to the construction of glass substrate 71, shield film 72, insulation film 73, low-resistance film 75, first electrode 76, and second electrode 77 shown in FIG. 7.

Figure 12:
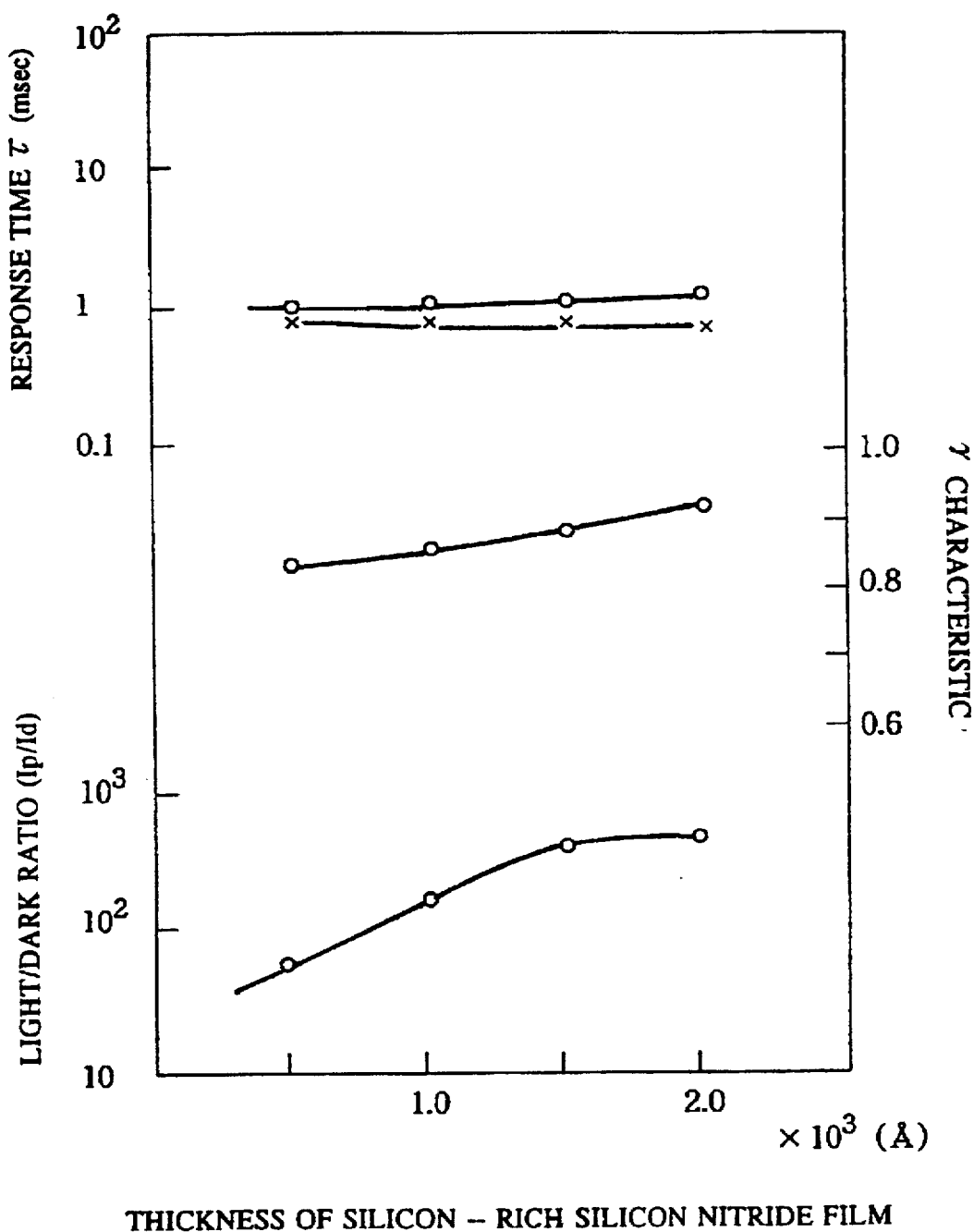
FIG. 12 is a graph showing the dependence of the light/dark ratio, γ characteristic and response time on the film thickness of the amorphous silicon film for the fifth embodiment.

FIG. 12 is a graph showing the dependence of the light/dark ratio, γ characteristic and response time on the film thickness of amorphous silicon film when the silicon-rich silicon nitride film contacting the insulation layer is formed to 50 nm and the silicon-rich silicon nitride film on the amorphous silicon film is formed to 200 nm. From this graph, it can be seen that the amorphous silicon film is preferably formed to 150 nm or more.

Sixth Embodiment

Figure 13:
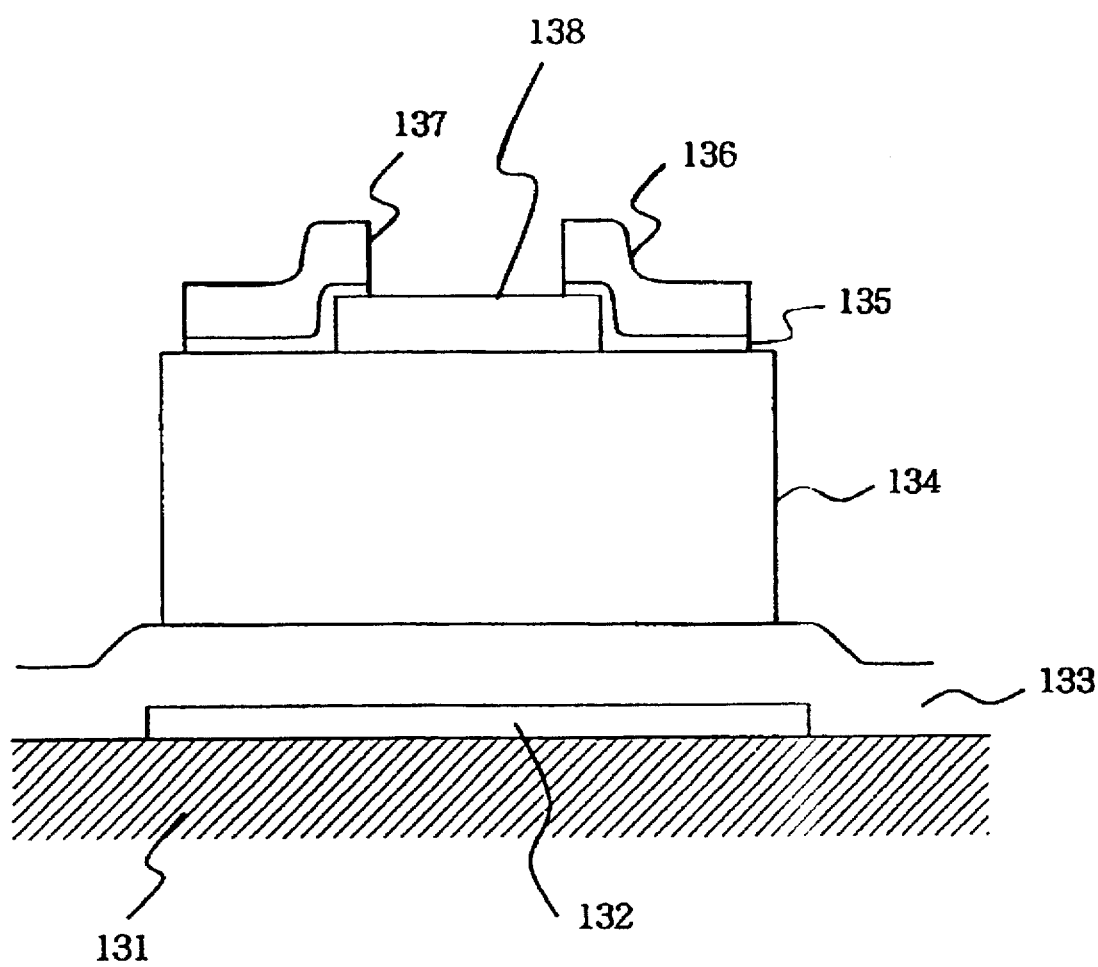
FIG. 13 is a schematic sectional view showing the construction of the sixth embodiment of the present invention.

FIG. 13 is a schematic sectional view showing the construction of the sixth embodiment of the present invention. In the photoelectric conversion element of this embodiment, first insulation film 133, photoelectric conversion film 134, and second insulation film 138, which is a second insulation film converted to islands, are successively stacked on light shield film 132 on glass substrate 131, which is a transparent insulating substrate; first electrode 136 and second electrode 137 connecting together the islands of insulation film 138 are formed at a prescribed interval and prescribed widths so as to cover the upper surface of the end portion of insulation film 138; and low-resistance film 135 is provided between insulation film 138 and each electrode 136, 137.

The photoelectric conversion element of this embodiment configured as described hereinabove is formed by the same processes as are used in the first embodiment shown in FIG. 1 and FIG. 2 up to the formation of photoelectric conversion film 134 as a photoelectric conversion layer, this layer being an amorphous silicon film. After forming photoelectric conversion film 134, an insulating silicon nitride film that serves as second insulation film 138 is stacked; second insulation film 138 is converted to islands; and photoelectric conversion film 134, which is an amorphous silicon film, is also converted to islands.

Next, the surface is washed with 0.5% buffered hydrofluoric acid, an n⁺layer is formed as low-resistance film 135, following which chrome electrodes serving as first electrode 136 and second electrode 137 are formed. Low-resistance film 135 is then removed by a dry-etching method from the portion which is to be the channel portion over second insulation film 138, and finally, an insulating silicon nitride film is formed as a protective film (not shown in the figure). The conditions for forming photoelectric conversion film 134 here are the same as in the first embodiment, and the film thickness is 4000 Å. Second insulation film 138 of the channel portion is formed to 1000 Å under the same film forming conditions as for the insulating silicon nitride film in the first embodiment.

Figure 14:
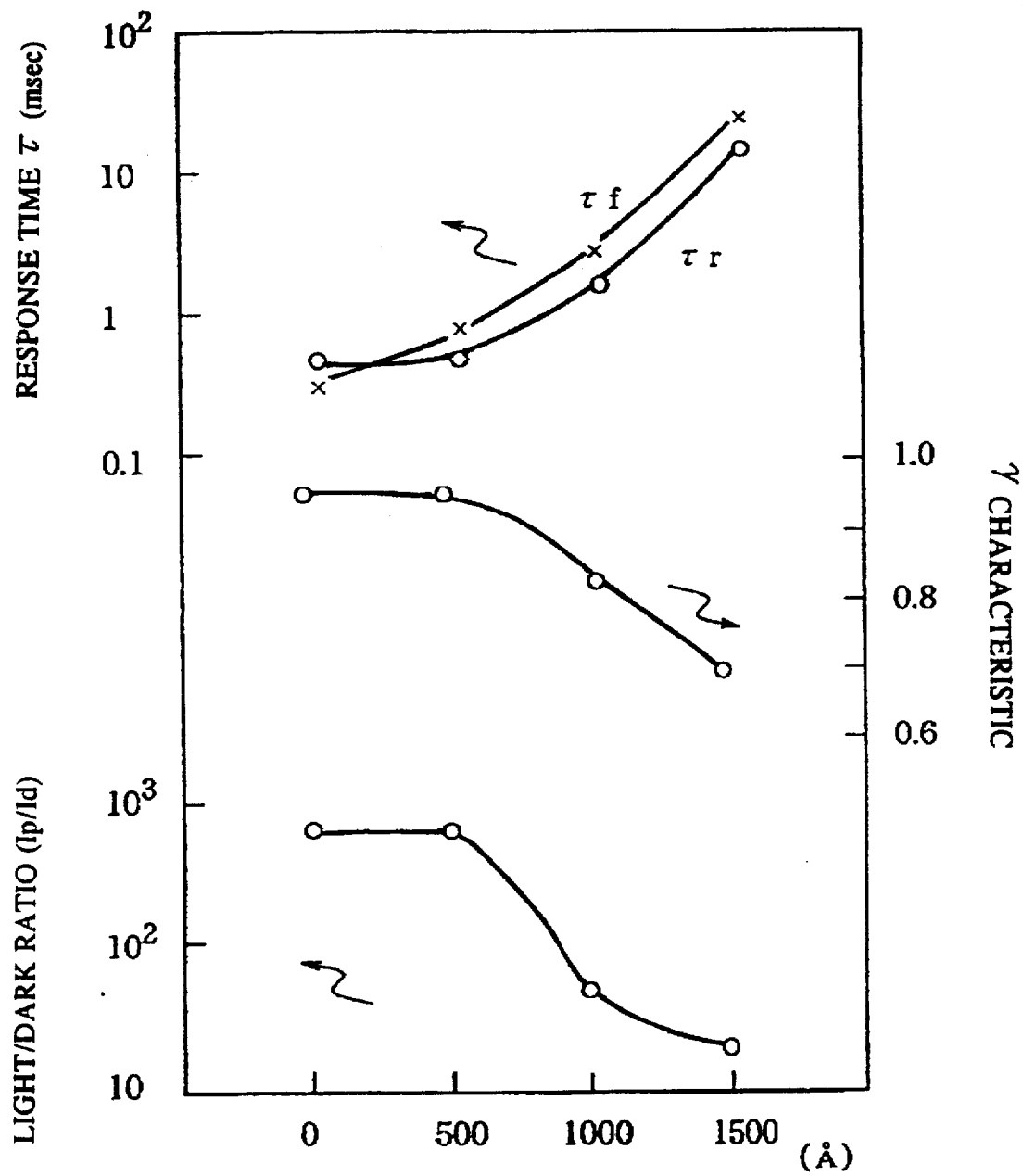
FIG. 14 is a graph showing the dependence of the light/dark ratio, γ characteristic, and response time on the amount of cutting of the insulation film on the upper surface of the back channel for the sixth embodiment.

FIG. 14 is a graph showing the dependence of the light/dark ratio, γ characteristic, and response time on the amount of cutting of insulation film 138 of the backchannel. This illustrates the influence of channel cutting on the backchannel, and demonstrates that a cut of 50 nm or less is preferable for film thickness of 100 nm.

Essentially, second insulation film 138 on the backchannel serves to protect the backchannel, and when carrying out etching of low-resistance layer 135, at least 50 nm must be left to allow for the effect of plasma damage in dry-etching.

Seventh Embodiment

Figure 15:
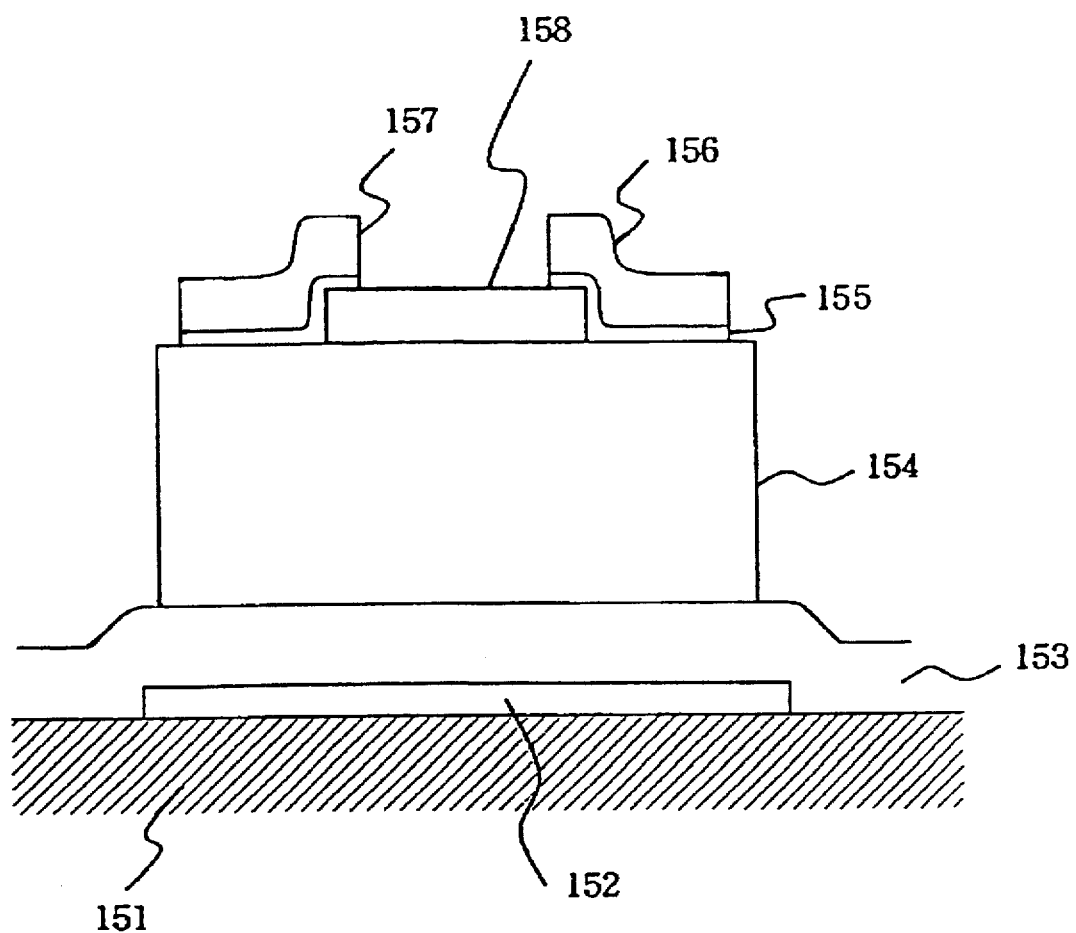
FIG. 15 is a schematic sectional view showing the construction of the seventh embodiment of the present invention.

FIG. 15 is a schematic sectional view showing the construction of the seventh embodiment of the present invention. The photoelectric conversion element of this embodiment has nearly the same construction as the photoelectric conversion element shown in the sixth embodiment, and second insulation film 138 composed of an insulating silicon nitride film over the backchannel shown in FIG. 13 is here second photoelectric conversion film 158 composed of a silicon-rich silicon nitride film manufactured under the same conditions as in the second embodiment shown in FIG. 4. Otherwise, the construction of glass substrate 151, shield film 152, insulation film 153, first photoelectric conversion film 154, low-resistance film 155, first electrode 156, and second electrode 157 is identical to that of glass substrate 131, shield film 132, first insulation film 133, photoelectric conversion film 134, low-resistance film 135, first electrode 136, and second electrode 137 shown in FIG. 13.

Figure 16:
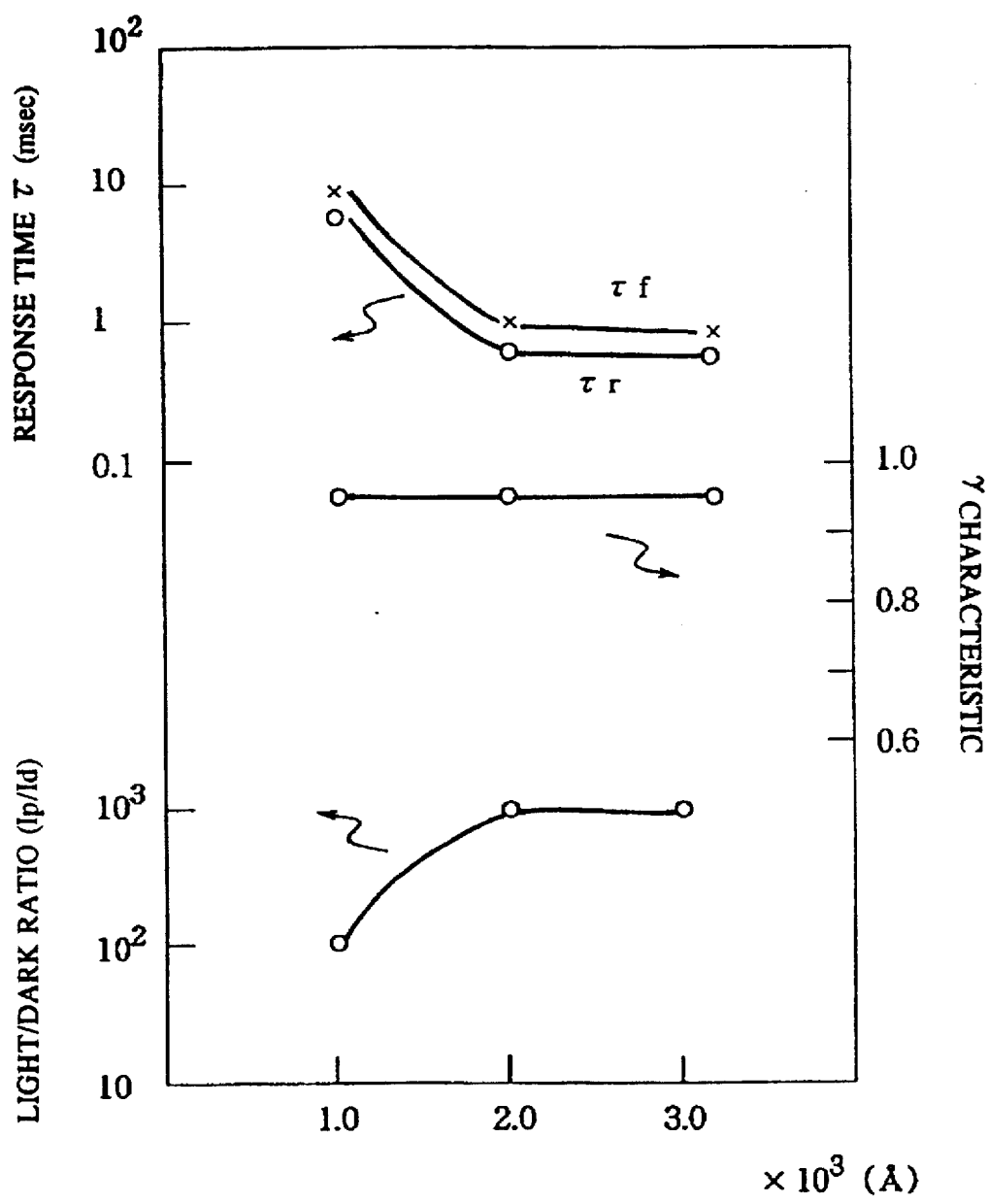
FIG. 16 is a graph showing the dependence of the light/dark ratio, γ characteristic and response time on the film thickness of the silicon-rich silicon nitride film for the sixth embodiment.

FIG. 16 is a graph showing the dependence of the light/dark ratio, γ characteristic, and response time in relation to the film thickness of a silicon-rich silicon nitride film. As can be seen from the graph, response is good when the film thickness of the silicon-rich silicon nitride film is 200 nm or more, and such a construction is desirable.

With the construction described hereinabove, the present invention provides the following effects:

The invention has the effects of enabling a shorter response time and improving the light/dark ratio and γ characteristic.

Through the use of a silicon-rich silicon nitride film, the invention has the effect of providing a photoelectric conversion element that allows suppression of the formation of channels and transient currents.

The invention has the effect of greatly improving the light/dark ratio, γ characteristic, and response time by preventing channel formation in the MIS plane, reducing lattice defects in the backchannel portion, and reducing band distortion in the backchannel bonding plane.

In addition to enabling shortened response time and improved light/dark ratio and γ characteristic, the invention allows easy protection of the backchannel.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A photoelectric conversion element characterized in that an insulation film and a photoelectric conversion film converted to islands are successively stacked on a light shield film formed on a transparent insulating substrate, electrodes connecting together said photoelectric conversion film islands are formed at a prescribed interval and in a prescribed width so that each of said electrodes covers an upper surface of a different end portion of said photoelectric conversion film, and a low-resistance film is provided between said photoelectric conversion film and said electrodes.

2. A photoelectric conversion element comprising a first insulation film, a photoelectric conversion film, and a second insulation film that is converted to islands are successively stacked on a shield film formed on a transparent insulating substrate, electrodes connecting together the islands of said second insulation film formed at a prescribed interval and in prescribed widths so that each of said electrodes covers an upper surface of a different end portion of said second insulation film, and a low-resistance film provided between said second insulation film and said electrodes.

3. A photoelectric conversion element comprising an insulation film, a first photoelectric conversion film, and a second photoelectric conversion film, which is a silicon-rich silicon nitride film converted to islands, stacked successively on a shield film formed on a transparent insulating substrate; electrodes connecting together the islands of said second photoelectric conversion film formed at a prescribed interval and in prescribed widths so that each of said electrodes covers an upper surface of a different end portion of said second photoelectric conversion film; and a low-resistance film provided between said second photoelectric conversion film and said electrodes.

4. A photoelectric conversion element comprising an insulation film and a photoelectric conversion film successively stacked on a shield film formed on a transparent insulating substrate, two electrodes formed at a prescribed interval and in prescribed widths so that each of said electrodes covers an upper surface of a different end portion of said photoelectric conversion film, and a low-resistance film between each of said electrodes and said photoelectric conversion film, said photoelectric conversion film being a silicon-rich silicon nitride film having a nitrogen to silicon ratio, N/Si, of 0.3 to 1.0.

5. A photoelectric conversion element comprising an insulation film and a photoelectric conversion film successively stacked on a shield film formed on a transparent insulating substrate, two electrodes formed at a prescribed interval and in prescribed widths so that each of said electrodes covers an upper surface of a different end portion of said photoelectric conversion film and a low-resistance film between each of said electrodes and said photoelectric conversion film, said photoelectric conversion film being a stacked structure comprising at least one or more of both an amorphous silicon film and a silicon-rich silicon nitride film having a nitrogen-to-silicon ratio, N/Si, of 0.3 to 1.0.

6. A photoelectric conversion element according to claim 5 wherein said photoelectric conversion film is a stacked structure comprising a silicon-rich silicon nitride film having a nitrogen to silicon composition ratio, N/Si, of 0.3–1.0 and an amorphous silicon film that are successively stacked on said insulation film, said silicon-rich silicon nitride film having a film thickness of 100 nm or less.

7. A photoelectric conversion element according to claim 5 wherein said photoelectric conversion film is a stacked structure comprising an amorphous silicon film, a silicon-rich silicon nitride film having a nitrogen to silicon composition ratio, N/Si, of 0.3–1.0, and an amorphous silicon film that are successively stacked on said insulation film, said silicon-rich silicon nitride film having a film thickness of 100 nm or more.

8. A photoelectric conversion element according to claim 5 wherein said photoelectric conversion film is a stacked structure comprising a silicon-rich silicon nitride film having a nitrogen to silicon composition ratio, N/Si, of 0.3–1.0, an amorphous film, and a silicon-rich silicon nitride film having a nitrogen to silicon composition ratio, N/Si, of 0.3–1.0 that are successively stacked on said insulation film, the lower silicon-rich silicon nitride film having a film thickness of 100 nm or less and the upper silicon-rich silicon nitride film having a film thickness of 100 nm or more.

* * * * *